United States Patent
Tanaka (10) Patent No.: US 10,914,893 B2
(45) Date of Patent: Feb. 9, 2021

(54) OPTICAL WAVEGUIDE LAMINATE AND METHOD OF MANUFACTURING SAME

(71) Applicant: NITTO DENKO CORPORATION, Ibaraki (JP)

(72) Inventor: Naoyuki Tanaka, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 344 days.

(21) Appl. No.: 16/084,689

(22) PCT Filed: Feb. 7, 2017

(86) PCT No.: PCT/JP2017/004290
§ 371 (c)(1),
(2) Date: Sep. 13, 2018

(87) PCT Pub. No.: WO2017/163634
PCT Pub. Date: Sep. 28, 2017

(65) Prior Publication Data
US 2020/0301067 A1    Sep. 24, 2020

(30) Foreign Application Priority Data
Mar. 22, 2016 (JP) .................................. 2016-056523

(51) Int. Cl.
*G02B 6/122* (2006.01)
*G02B 6/13* (2006.01)

(52) U.S. Cl.
CPC ............... *G02B 6/122* (2013.01); *G02B 6/13* (2013.01)

(58) Field of Classification Search
CPC ........ G02B 6/122; G02B 6/13; G02B 6/3885; G02B 6/4293; G02B 6/43; G02B 6/138; G02B 1/04
See application file for complete search history.

(56) References Cited

U.S. PATENT DOCUMENTS

| 10,393,966 B2 * | 8/2019 | Okada ................. G02B 6/1223 |
| 2009/0067796 A1 | 3/2009 | Fujii et al. |

(Continued)

FOREIGN PATENT DOCUMENTS

| CN | 102308236 A | 1/2012 |
| CN | 102455464 A | 5/2012 |

(Continued)

OTHER PUBLICATIONS

Notification of Transmittal of Translation of the International Preliminary Report on Patentability (Form PCT/IB/338) issued in counterpart International Application No. PCT/JP2017/004290 dated Oct. 4, 2018, with Forms PCT/IB/373 and PCT/ISA/237. (6 pages).

(Continued)

*Primary Examiner* — John Bedtelyon
(74) *Attorney, Agent, or Firm* — Westerman, Hattori, Daniels & Adrian, LLP (57) ABSTRACT

There is provided an optical waveguide laminate in which an organic base material layer comprised of an insulation layer and a coverlay is laminated to one surface of an optical waveguide and in which a portion of the organic base material layer is lacking so that the optical waveguide is uncovered. Inequalities P≥70% and P−Q≥25% are satisfied where P is the laser light transmittance in at least a portion of the optical waveguide, the laser light having a predetermined wavelength range, and Q is the laser light transmittance of at least a portion of the organic base material layer. In this optical waveguide laminate, the organic base material layer laminated to the optical waveguide is elaborately removed without being impaired or thermally damaged by laser machining.

7 Claims, 9 Drawing Sheets

(56) References Cited

U.S. PATENT DOCUMENTS

| | | |
|---|---|---|
| 2009/0129786 A1 | 5/2009 | Deane |
| 2011/0299808 A1 | 12/2011 | Matsuoka et al. |
| 2012/0070117 A1 | 3/2012 | Juni |
| 2012/0107495 A1 | 5/2012 | Hirayama |
| 2013/0243370 A1 | 9/2013 | Tsujita et al. |
| 2013/0259430 A1* | 10/2013 | Tanaka ................ G02B 6/4204 385/88 |
| 2013/0287335 A1 | 10/2013 | Nakashiba et al. |
| 2013/0301980 A1* | 11/2013 | Tsujita .................. G02B 6/122 385/14 |
| 2013/0330035 A1 | 12/2013 | Shin et al. |
| 2014/0126857 A1 | 5/2014 | Masuda et al. |
| 2014/0314373 A1 | 10/2014 | Tseng |
| 2015/0147022 A1 | 5/2015 | Matsuda |

FOREIGN PATENT DOCUMENTS

| | | |
|---|---|---|
| CN | 103364893 A | 10/2013 |
| JP | 2009-69203 A | 4/2009 |
| JP | 2013-195533 A | 9/2013 |
| JP | 2013-235104 A | 11/2013 |
| JP | 2014-95782 A | 5/2014 |
| JP | 2014-115480 A | 6/2014 |
| KR | 20140075187 A | 6/2014 |
| TW | 201214246 A | 4/2012 |
| WO | 2012/093462 A1 | 7/2012 |
| WO | 2013/179522 A1 | 12/2013 |

OTHER PUBLICATIONS

International Search Report dated Apr. 25, 2017, issued in counterpart application No. PCT/JP2017/004290. (2 pages).

* cited by examiner

RELATED ART

FIG.11A

RELATED ART

FIG.11B

RELATED ART

OPTICAL WAVEGUIDE LAMINATE AND METHOD OF MANUFACTURING SAME

TECHNICAL FIELD

The present disclosure relates to an optical waveguide laminate in which an organic base material layer such as an insulative film is laminated to at least one surface of an optical waveguide, and a method of manufacturing the same.

BACKGROUND ART

Figure 10:
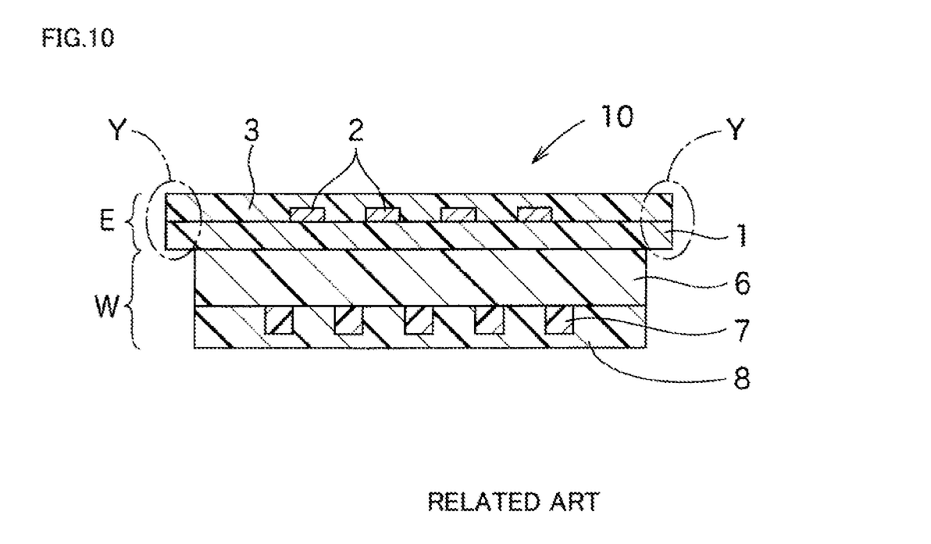
FIG. 10 is a schematic vertical sectional view showing an exemplary conventional opto-electric hybrid board.

With an increase in the amount of transmission information, optical interconnect lines in addition to electrical interconnect lines have been used in recent electronic devices and the like. A large number of opto-electric hybrid boards capable of transmitting electrical signals and optical signals at the same time have been used. As shown in FIG. 10, a known example of such opto-electric hybrid boards has a structure in which an electric circuit board E includes an insulation layer 1 made of polyimide or the like and serving as a substrate, and electrical interconnect lines 2 having an electrically conductive pattern and provided on the front surface of the insulation layer 1, and in which an optical waveguide W is provided on the back surface of the insulation layer 1 and optically coupled to an optical element to be mounted in a predetermined position of the electrical interconnect lines 2. The front surface of the electric circuit board E is insulated and protected by a coverlay 3. The optical waveguide W includes three layers: an under cladding layer 6; cores 7 serving as an optical path; and an over cladding layer 8.

The aforementioned opto-electric hybrid board 10 itself is mounted on an electronic device. In addition, the opto-electric hybrid board 10 formed into a strip shape and having a front end to which a ferrule for opto-electric connection is attached has been used as a connecting connector for connection between boards or between chips on a board.

As shown also in FIG. 10, the opto-electric hybrid board 10 is typically shaped such that opposite edge portions (portions surrounded by dash-and-dot lines Y) of the electric circuit board E protrude outwardly from opposite edge portions of the optical waveguide W on opposite sides thereof extending in the longitudinal direction of the optical waveguide W. This is due to a method of manufacturing the opto-electric hybrid board 10 which typically includes the steps of: initially producing the electric circuit board E; and then forming the under cladding layer 6, the cores 7, and the over cladding layer 8 in a stacked manner in the order named on the back surface of the electric circuit board E (that is, the back surface of the insulation layer 1 made of polyimide or the like) by a photolithographic process or the like while producing a predetermined pattern shape. It is common technical practice to form the outline shape of the optical waveguide W inside the outline shape of the electric circuit board E because the pattern shape is made by removing unnecessary portions after flat layers are formed. Also, a typical optical waveguide formed on one surface side of a substrate and slightly smaller in size than the substrate has been proposed (see PTL 1).

RELATED ART DOCUMENT

Patent Document

PTL 1: JP-A-2014-115480

SUMMARY OF INVENTION

Unfortunately, the opto-electric hybrid board 10 shaped such that the opposite edge portions of the electric circuit board E protrude outwardly from the opposite edge portions of the optical waveguide W has a problem in that the protruding portions are susceptible to impacts upon colliding with a transport guide or the like during the inspection of the product or during the transport or transfer thereof to become broken or cracked off, so that the electrical interconnect lines 2 absorb moisture to form rust, thereby resulting in deterioration in quality. In particular, the protruding portions of the electric circuit board E in the opto-electric hybrid board 10 to which flexibility is entirely imparted are more prone to become damaged because the electric circuit board E is extremely thin.

Figure 11A:
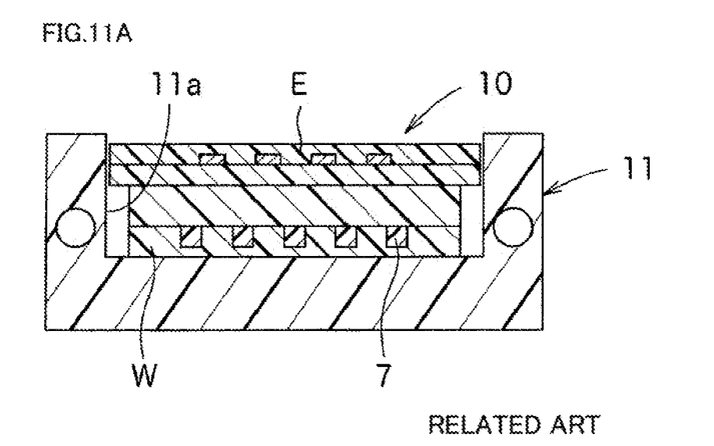
FIGS. 11A and 11B are illustrations about problems with conventional opto-electric hybrid boards.

The use of this opto-electric hybrid board 10 as a connecting connector involves the need for the operation of fitting and fixing a front end portion of the opto-electric hybrid board 10 into a recess 11a of a ferrule 11, as shown in FIG. 11A. If the opening of the recess 11a is designed to leave relatively large clearance from the outside shape of the electric circuit board E for the purpose of preventing damages to the protruding portions of the electric circuit board E, precise positioning of the cores 7 in the recess 11a is not achieved. This gives rise to a problem such that proper optical coupling by means of this connector is not achieved.

Figure 11B:
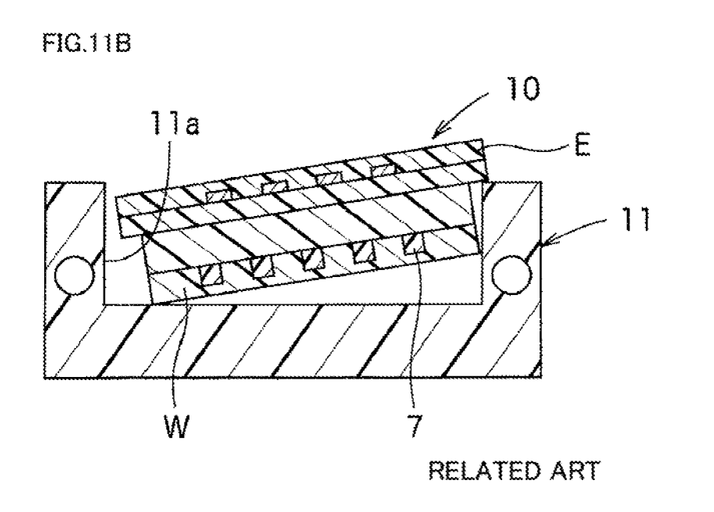

On the other hand, it may be contemplated that there is minimum possible clearance between the opening of the recess 11a of the ferrule 11 and the outside shape of the electric circuit board E for the purpose of achieving precise positioning of the cores 7. In that case, however, it is expected that the protruding portions of the electric circuit board E get caught on an opening edge of the recess 11a when the front end of the opto-electric hybrid board 10 is fitted into the recess 11a, as shown in FIG. 11B. As a result, this precludes the front end of the opto-electric hybrid board 10 from being smoothly fitted into the recess 11a to cause poor workability.

The present applicant has conceived an opto-electric hybrid board in which opposite longitudinal side surfaces of the optical waveguide W protrude sideways from opposite longitudinal side surfaces of the electric circuit board E, and has already applied for patent (Japanese Patent Application No. 2015-122725 filed on Jun. 18, 2015). This configuration, in which the opposite side surfaces of the optical waveguide W relatively thick and excellent in impact resistance protrude sideways, is advantageous in ease of handling and in that precise positioning or the like in the recess of the ferrule is achieved.

However, the steps of forming an optical waveguide W having an outline slightly smaller in size than the outline of an insulation layer on the back surface of the insulation layer serving as a base for the electric circuit board E, and thereafter removing unnecessary portions of the electric circuit board E, are required to obtain the opto-electric hybrid board including the optical waveguide W having the opposite side surfaces protruding sideways. The application of laser machining has been contemplated for the process of removing the electric circuit board E. Unless the thickness of a layer to be removed is properly set under strictly limited machining conditions, there is apprehension that not only the electric circuit board E but also the optical waveguide W lying under the electric circuit board E is flawed or thermally damaged.

In addition, if laser light transmittance is too high in to-be-removed portions of the electric circuit board E, the electric circuit board E cannot be removed. On the other hand, if laser light transmittance is too low in the optical waveguide W lying under the electric circuit board E, there is apprehension that the optical waveguide W is also removed. Thus, it is not easy to efficiently remove only unnecessary portions of the electric circuit board E with no influence exerted upon the optical waveguide W side. The establishment of a technique capable of laser machining more easily has been strongly desired.

In view of the foregoing, it is therefore an object of the present disclosure to provide an excellent optical waveguide laminate such as an opto-electric hybrid board in which an organic base material layer laminated to an optical waveguide is elaborately removed by laser machining and in which the optical waveguide is neither impaired nor thermally damaged by the laser machining but maintains high quality, and a method of manufacturing the same.

A first aspect of the present disclosure is intended for an optical waveguide laminate comprising: an optical waveguide; and an organic base material layer laminated to at least one surface of the optical waveguide, wherein the optical waveguide laminate has an uncovered optical waveguide portion in which a portion of the organic base material layer laminated to the optical waveguide is lacking so that the optical waveguide is uncovered in the portion, and wherein the following inequalities (1) and (2) are satisfied:

$$P \geq 70\% \tag{1}$$

$$P-Q \geq 25\% \tag{2}$$

where P is laser light transmittance of the optical waveguide, the laser light having a predetermined wavelength range, and Q is laser light transmittance of the organic base material layer.

In particular, a second aspect of the present disclosure is intended for the optical waveguide laminate wherein the laser light transmittance Q of the organic base material layer is not greater than 70%. In particular, a third aspect of the present disclosure is intended for the optical waveguide laminate wherein the organic base material layer is a polyimide resin layer. Further, a fourth aspect of the present disclosure is in particular intended for the optical waveguide laminate wherein an end surface of the organic base material layer is a laser-cut surface.

A fifth aspect of the present disclosure is intended for a method of manufacturing an optical waveguide laminate. The method comprises the steps of: laminating an organic base material layer to at least one surface of an optical waveguide; and removing a portion of the organic base material layer by irradiating the portion of the organic base material with laser light having a predetermined wavelength range, thereby forming an uncovered optical waveguide portion, wherein P, a laser light transmittance of the optical waveguide, and Q, a laser light transmittance of the organic base material, satisfy the following inequalities (1) and (2):

$$P \geq 70\% \tag{1}$$

$$P-Q \geq 25\% \tag{2}$$

In particular, a sixth aspect of the present disclosure is intended for the method of manufacturing an optical waveguide laminate wherein the laser light transmittance Q of the organic base material layer is not greater than 70%. In particular, a seventh aspect of the present disclosure is intended for the method of manufacturing an optical waveguide laminate wherein the organic base material layer is a polyimide resin layer.

The optical waveguide laminate according to the present disclosure is configured such that the organic base material layer is laminated to at least one surface of the optical waveguide, and has the uncovered optical waveguide portion in which a portion of the organic base material layer is lacking so that the optical waveguide is uncovered in the portion. The optical waveguide laminate is characterized in that the laser light transmittance P of the optical waveguide and the laser light transmittance Q of at least a portion of the organic base material layer differ significantly from each other. More specifically, the transmittance P of the optical waveguide portion and the transmittance Q of the organic base material layer satisfy the following inequalities (1) and (2).

$$P \geq 70\% \tag{1}$$

$$P-Q \geq 25\% \tag{2}$$

During the operation of removing the portion of the organic base material layer by laser light irradiation, this configuration achieves the operation of effectively removing the organic base material layer by means of laser light, and allows the laser light to pass through the optical waveguide lying under the organic base material layer, thereby exerting no influence upon the optical waveguide. This provides an elaborate end surface of the organic base material layer which faces the uncovered optical waveguide portion. The surface of the optical waveguide partially uncovered by the operation of removing the organic base material layer is not impaired by the laser light, and the interior of the optical waveguide is not thermally damaged. Thus, high quality is maintained.

In particular, the present disclosure in which the transmittance Q of the organic base material layer is not greater than 70% provides a wider selection of the materials of the optical waveguide which make a difference of not less than 25% in transmittance from the organic base material layer. This provides a combination of the optical waveguide of higher quality and the organic base material layer.

In particular, the present disclosure in which the organic base material layer is a polyimide resin layer provides the organic base material layer excellent in insulation properties and thermal resistance. This is suitable for the application to an opto-electric hybrid board or the like.

As mentioned above, the present disclosure in which a portion of the organic base material layer is removed by means of laser light irradiation and in which an end surface of the organic base material layer which faces the uncovered optical waveguide portion is a laser-cut surface provides the laser-cut surface of excellent machining accuracy and of high quality.

The method of manufacturing an optical waveguide laminate according to the present disclosure facilitates the setting of laser machining conditions during the operation of removing the organic base material layer by means of the laser light irradiation to achieve the operation of removing the organic base material layer with efficiency without affecting the optical waveguide.

In particular, the manufacturing method in which the transmittance Q of the organic base material layer is not greater than 70% provides a wider selection of the materials of the optical waveguide which make a difference of not less than 25% in transmittance from the organic base material layer. This provides a combination of the optical waveguide of higher quality and the organic base material layer.

In particular, the manufacturing method in which the organic base material layer is a polyimide resin layer provides the organic base material layer excellent in insulation properties and thermal resistance and suitable for the removal operation by means of the laser light irradiation. Thus, the manufacturing method provides the optical waveguide laminate such as an opto-electric hybrid board of higher quality with efficiency.

DESCRIPTION OF EMBODIMENTS

Next, embodiments according to the present disclosure will now be described in detail with reference to the drawings.

Figure 1A:
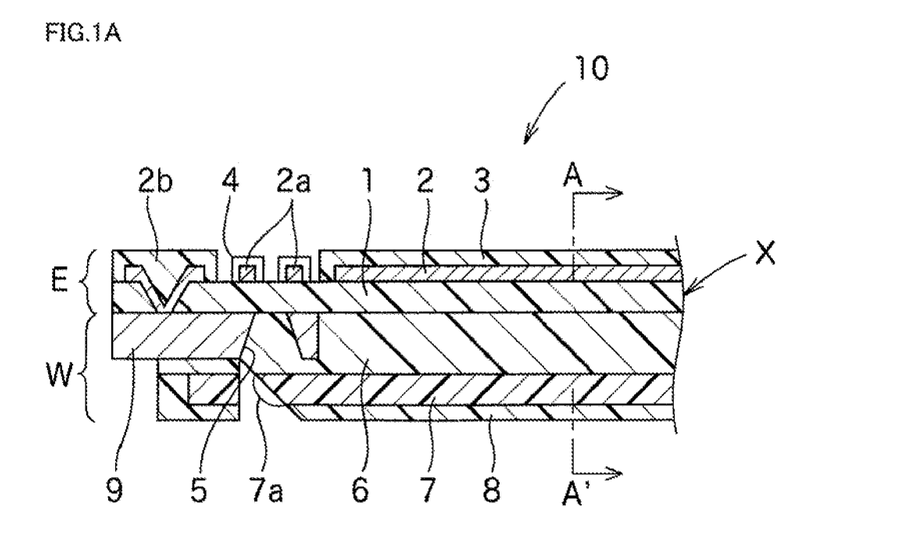
FIG. 1A is a schematic partial vertical sectional view of one embodiment of the present disclosure applied to an opto-electric hybrid board.
Figure 1B:
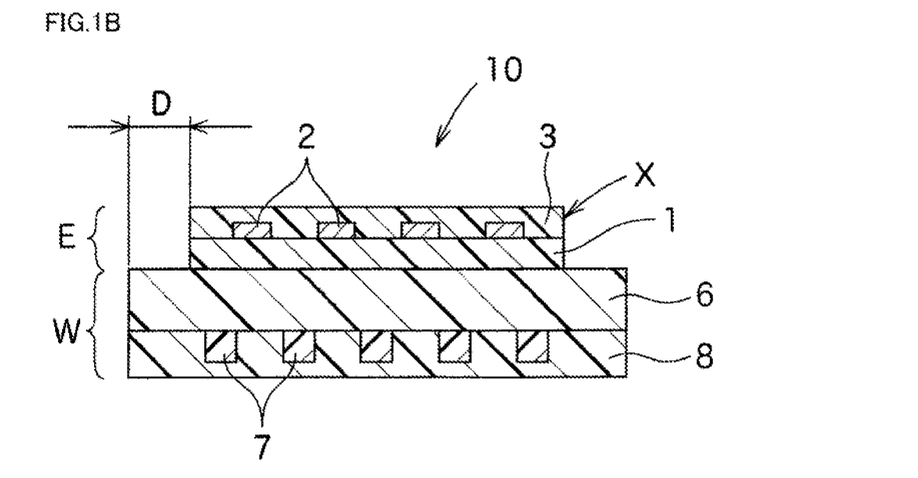
FIG. 1B is a sectional view taken along the line A-A' of FIG. 1A.

FIG. 1A is a schematic partial vertical sectional view of one embodiment in which an optical waveguide laminate according to the present disclosure is applied to an opto-electric hybrid board. FIG. 1B is a sectional view taken along the line A-A' of FIG. 1A. This opto-electric hybrid board 10 includes: an electric circuit board E including an insulation layer 1 and electrical interconnect lines 2 provided on the front surface of the insulation layer 1; and an optical waveguide W provided on the back surface side of the insulation layer 1.

In the electric circuit board E, the electrical interconnect lines 2 including optical element mounting pads 2a, a grounding electrode 2b, other pads for mounting various elements, connector mounting pads, and the like (not shown) are formed on the front surface of the insulation layer 1 made of polyimide. The electrical interconnect lines 2 except the pads 2a and the like are insulated and protected by a coverlay 3 made of the same polyimide as the insulation layer 1. The front surface of the pads 2a and the like not covered with the coverlay 3 is covered with an electroplated layer 4 made of gold, nickel, or the like.

The optical waveguide W provided on the back surface side of the insulation layer 1 includes an under cladding layer 6, cores 7 formed in a predetermined pattern on the front surface (the lower surface as seen in FIG. 1A) of the under cladding layer 6, and an over cladding layer 8 integral with the front surface of the under cladding layer 6 while covering the cores 7. The reference numeral 9 designates a metal layer provided on the back surface of the insulation layer 1 and for reinforcing the opto-electric hybrid board 10. The metal layer 9 is patterned in a portion other than where flexibility is required. The metal layer 9 is provided with a through hole 5 for ensuring an optical path between the cores 7 and an optical element. The under cladding layer 6 extends into the through hole 5.

A portion of each of the cores 7 corresponding to the optical element mounting pads 2a of the electric circuit board E is in the form of an inclined surface at 45 degrees with respect to the longitudinal direction of the cores 7. The inclined surface serves as a light reflecting surface 7a. The light reflecting surface 7a functions to change the direction of light propagated in each of the cores 7 by 90 degrees to cause the light to enter a light-receiving portion of an optical element or to change the direction of light exiting a light-emitting portion of an optical element by 90 degrees to cause the light to enter each of the cores 7.

As shown in FIG. 1B, the opto-electric hybrid board 10 is configured such that opposite side surfaces of the electric circuit board E extending in the longitudinal direction of the optical waveguide W are disposed inwardly from the position of opposite side surfaces of the optical waveguide W as seen from above, and is shaped such that the optical waveguide W protrudes leftwardly and rightwardly from the electric circuit board E.

Figure 6:
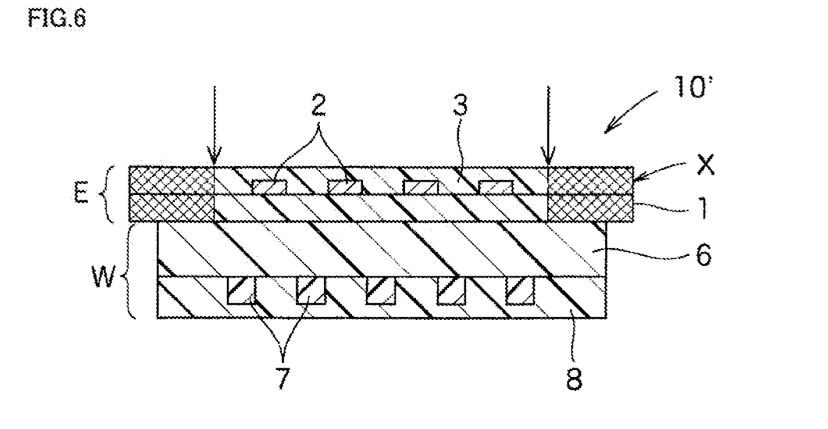
FIG. 6 is an illustration showing a laser light irradiation step in the method of manufacturing the opto-electric hybrid board.

The portions of the optical waveguide W which protrude leftwardly and rightwardly from the electric circuit board E are intentionally uncovered portions of the optical waveguide W which are obtained by removing left-hand and right-hand side portions of the electric circuit board E having initially been stacked on the optical waveguide W by means of laser light irradiation in the course of the manufacture of this opto-electric hybrid board (with reference to FIG. 6).

The left-hand and right-hand side portions of the electric circuit board E which are removed by means of the laser light irradiation are unnecessary portions in which the electrical interconnect lines 2 or the like are not formed, and are comprised of the insulation layer 1 and the coverlay 3. The insulation layer 1 and the coverlay 3 in the electric circuit board E correspond to an "organic base material layer X" in the present disclosure. The insulation layer 1 and the coverlay 3 are made of the same material, and have a low laser light transmittance Q (in this example, laser light having a wavelength of 355 nm) used for the operation of removing the electric circuit board E. A resin material less permeable to this laser light is used for the insulation layer 1 and the coverlay 3.

The leftwardly and rightwardly protruding portions of the optical waveguide W uncovered by the removal of the insulation layer 1 and the coverlay 3 are comprised of the under cladding layer 6 and the over cladding layer 8. The under cladding layer 6 and the over cladding layer 8 are made of the same material, and are as permeable to the laser light as possible so that the portions of the optical waveguide W are prevented from being impaired and thermally damaged during the removal operation by means of the aforementioned laser light irradiation. Both of the under cladding layer 6 and the over cladding layer 8 have a laser light transmittance P (in this example, laser light having a wavelength of 355 nm) used for the aforementioned laser light irradiation. The laser light transmittance P is much higher than the transmittance Q of the organic base material layer X.

Next, a method of manufacturing the opto-electric hybrid board will be described (with reference to FIGS. 2A to 2D, 3A to 3D, 4A to 4D, 5A to 5D, and 6).

Figure 2A:
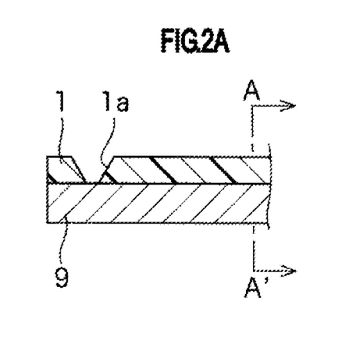
FIG. 2A is an illustration showing a step for producing an electric circuit board in a method of manufacturing the opto-electric hybrid board.
Figure 2B:
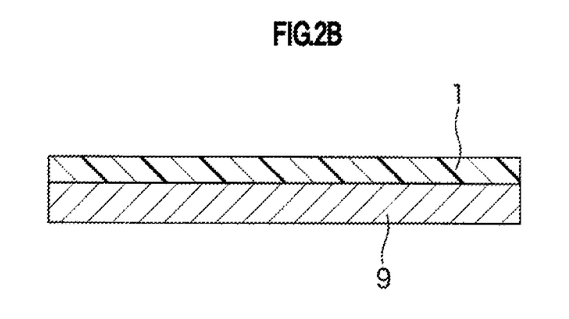
FIG. 2B is an illustration of a section taken along the line A-A' of FIG. 2A.

First, the metal layer 9 of a planar configuration is prepared. A photosensitive insulating resin including polyimide and having a low laser light transmittance Q, the laser light having a wavelength of 355 nm, is applied to the front surface of the metal layer 9 to form the insulation layer 1 having a predetermined pattern by a photolithographic process (with reference to FIG. 2A and FIG. 2B showing a section taken along the line A-A' of FIG. 2A). In this example, a hole 1a for uncovering the front surface of the metal layer 9 is formed for the purpose of forming the grounding electrode 2b in contact with the metal layer 9. The insulation layer 1 has a thickness in the range of 1 to 50 μm, for example.

Figure 2C:
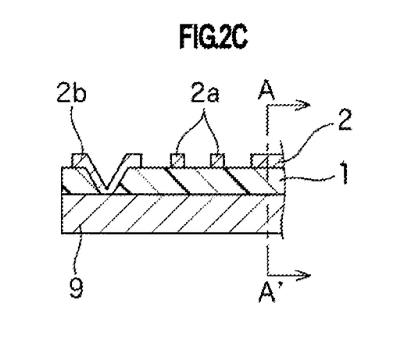
FIG. 2C is an illustration showing a step for producing the electric circuit board.
Figure 2D:
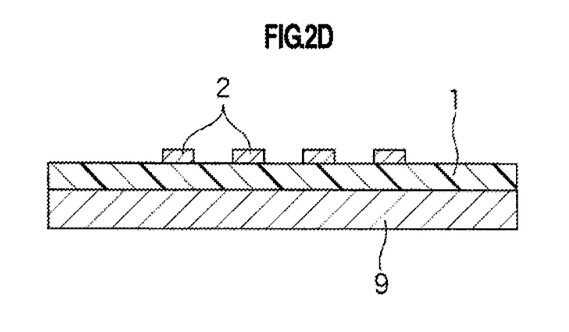
FIG. 2D is an illustration of a section taken along the line A-A' of FIG. 2C.

Next, as shown in FIG. 2C and FIG. 2D showing a section taken along the line A-A' of FIG. 2C, the electrical interconnect lines 2 (including the optical element mounting pads 2a, the grounding electrode 2b, and other pads; the same shall apply hereinafter) are formed on the front surface of the insulation layer 1 by a semi-additive process, for example.

Figure 3A:
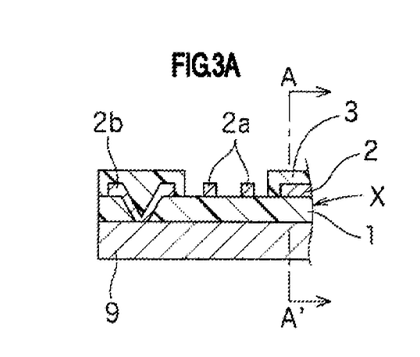
FIG. 3A is an illustration showing a step for producing the electric circuit board.
Figure 3B:
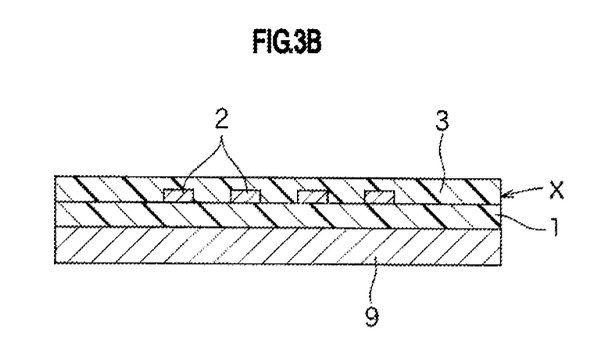
FIG. 3B is an illustration of a section taken along the line A-A' of FIG. 3A.

Next, as shown in FIG. 3A and FIG. 3B showing a section taken along the line A-A' of FIG. 3A, a photosensitive insulating resin (having a low laser light transmittance Q, the laser light having a wavelength of 355 nm) including polyimide that is the same as the polyimide used for the insulation layer 1 is applied to portions of the electrical interconnect lines 2 other than the optical element mounting pads 2a and other pads to form the coverlay 3 by a photolithographic process. The coverlay 3 has a thickness in the range of 1 to 50 μm, for example.

Figure 3C:
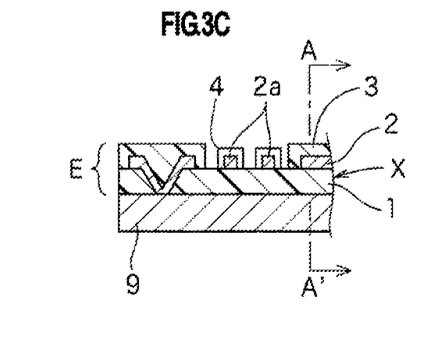
FIG. 3C is an illustration showing a step for producing the electric circuit board.
Figure 3D:
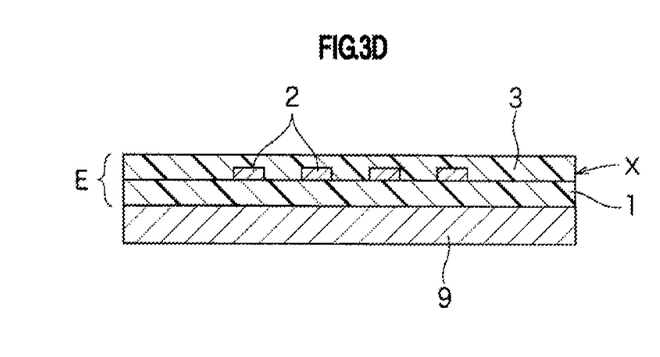
FIG. 3D is an illustration of a section taken along the line A-A' of FIG. 3C.

Then, as shown in FIG. 3C and FIG. 3D showing a section taken along the line A-A' of FIG. 3C, the electroplated layer 4 is formed on the front surfaces of the optical element mounting pads 2a and other pads. In this manner, the electric circuit board E is formed.

Next, a photosensitive resist is laminated to opposite surfaces of a laminate comprised of the metal layer 9 and the electric circuit board E. Thereafter, holes are formed by a photolithographic process in portions of the photosensitive resist on the back surface side (the surface side opposite from the electric circuit board E) of the metal layer 9 which correspond to a portion not requiring the metal layer 9 and a portion where the through hole for the optical path is to be formed, so that the back surface of the metal layer 9 is partially uncovered.

Figure 4A:
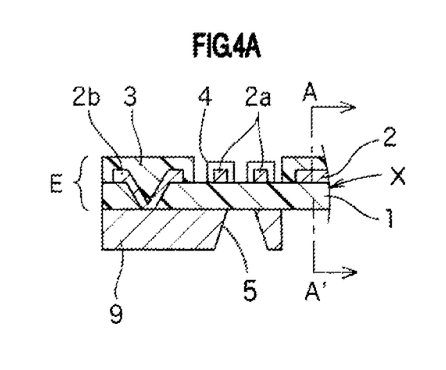
FIG. 4A is an illustration showing a step for producing an optical waveguide in the method of manufacturing the opto-electric hybrid board.
Figure 4B:
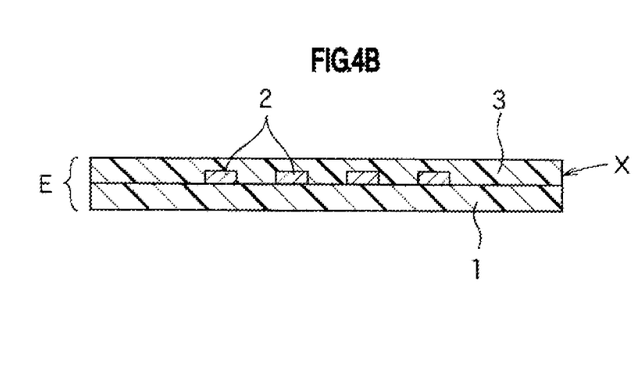
FIG. 4B is an illustration of a section taken along the line A-A' of FIG. 4A.

Then, the uncovered portions of the metal layer 9 are removed by etching, so that the insulation layer 1 is uncovered in the sites where the metal layer 9 is removed. Thereafter, the photosensitive resist is stripped away using an aqueous sodium hydroxide solution or the like. Thus, as shown in FIG. 4A and FIG. 4B showing a section taken along the line A-A' of FIG. 4A, the metal layer 9 is formed only in a region where reinforcement is required, and the through hole 5 for the optical path is formed at the same time.

Figure 4C:
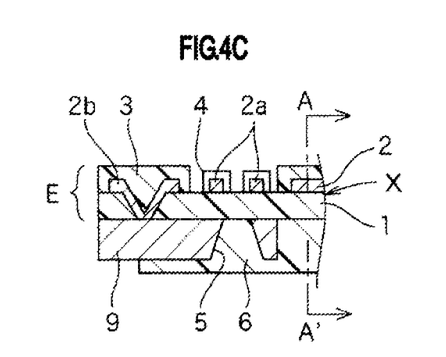
FIG. 4C is an illustration showing a step for producing the optical waveguide.
Figure 4D:
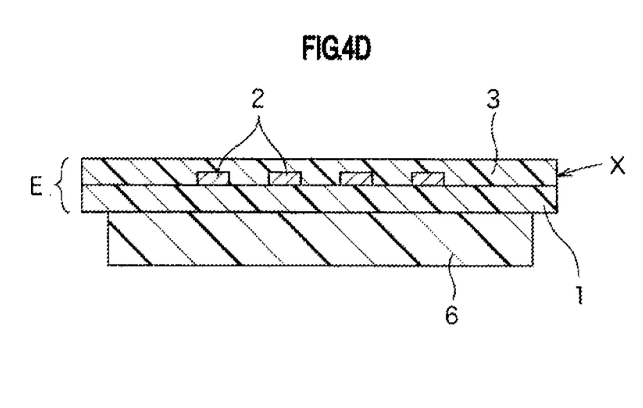
FIG. 4D is an illustration of a section taken along the line A-A' of FIG. 4C.

For the formation of the optical waveguide W (with reference to FIG. 1A) on the back surface of the insulation layer 1 (the back surface of the metal layer 9 in the portion where the metal layer 9 is formed), a photosensitive resin which is a material for the formation of the under cladding layer 6 having a high laser light transmittance P, the laser light having a wavelength of 355 nm, is initially applied to the back surfaces (the lower surfaces as seen in the figure) of the insulation layer 1 and the metal layer 9, as shown in FIG. 4C and FIG. 4D showing a section taken along the line A-A' of FIG. 4C. Thereafter, the applied layer is exposed to irradiation light. This exposure cures the applied layer to form the under cladding layer 6. At this time, the under cladding layer 6 may be formed into a predetermined pattern by a photolithographic process. The under cladding layer 6 enters and fills the through hole 5 for the optical path in the metal layer 9. The under cladding layer 6 has a thickness (thickness as measured from the back surface of the insulation layer 1) generally greater than the thickness of the metal layer 9. For example, the under cladding layer 6 has a thickness in the range of 1 to 200 μm. A series of operations for the formation of the optical waveguide W are performed while the back surface of the insulation layer 1 on which the metal layer 9 is formed is oriented upward. However, the orientation is shown unchanged in the figures.

Figure 5A:
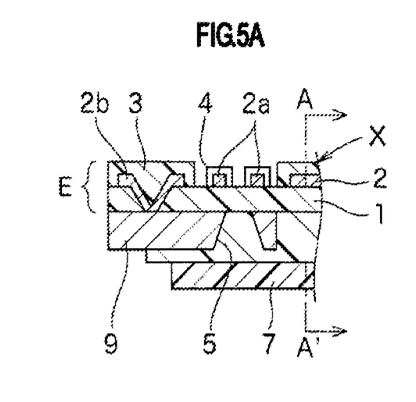
FIG. 5A is an illustration showing a step for producing the optical waveguide.
Figure 5B:
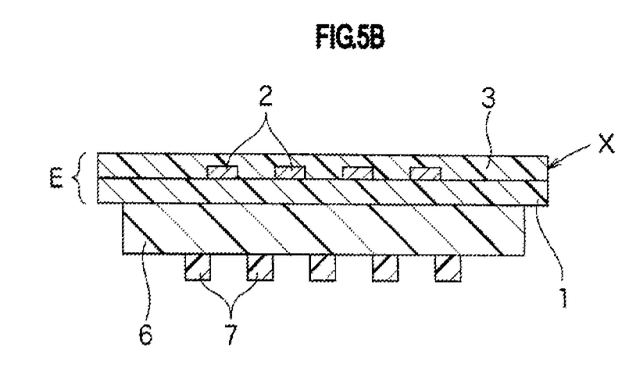
FIG. 5B is an illustration of a section taken along the line A-A' of FIG. 5A.

Next, as shown in FIG. 5A and FIG. 5B showing a section taken along the line A-A' of FIG. 5A, the cores 7 having a predetermined pattern are formed on the front surface (the lower surface as seen in the figure) of the under cladding layer 6 by a photolithographic process. The cores 7 have a thickness in the range of 1 to 200 μm, for example, and a width in the range of 3 to 100 μm, for example. An example of the material for the formation of the cores 7 includes a photosensitive resin similar to that for the under cladding layer 6, and the material used herein has a refractive index higher than that of the materials for the formation of the under cladding layer 6 and the over cladding layer 8 to be described below. The adjustment of these refractive indices may be made, for example, by adjusting the selection of the types of the materials for the formation of the under cladding layer 6, the cores 7, and the over cladding layer 8, and the composition ratio thereof.

Figure 5C:
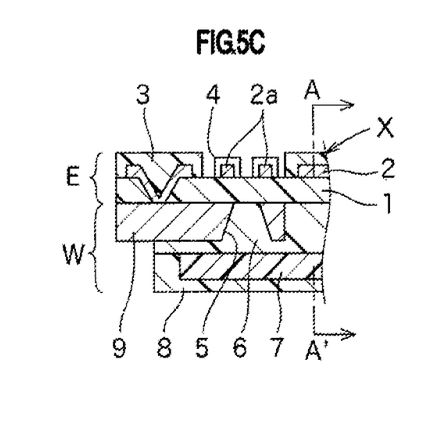
FIG. 5C is an illustration showing a step for producing the optical waveguide.
Figure 5D:
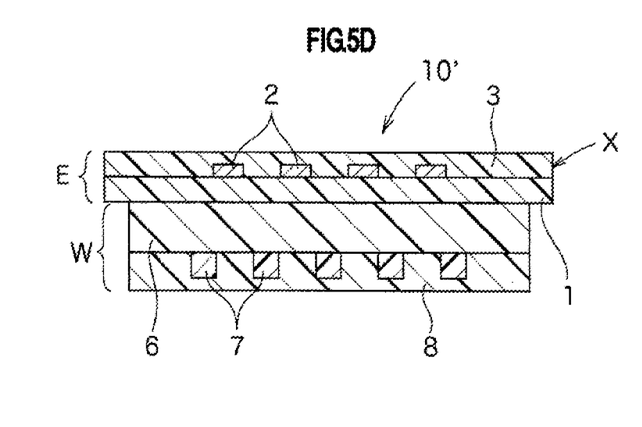
FIG. 5D is an illustration of a section taken along the line A-A' of FIG. 5C.

Next, as shown in FIG. 5C and FIG. 5D showing a section taken along the line A-A' of FIG. 5C, the over cladding layer 8 is formed on the front surface (the lower surface as seen in the figure) of the under cladding layer 6 by a photolithographic process so as to cover the cores 7. In this manner, the optical waveguide W is formed. The over cladding layer 8 has a thickness (thickness as measured from the front surface of the under cladding layer 6) not less than that of the cores 7 and not greater than 300 μm, for example. An example of the material for the formation of the over cladding layer 8 includes a photosensitive resin (having a high laser light transmittance P, the laser light having a wavelength of 355 nm) similar to that for the under cladding layer 6.

In this manner, an opto-electric hybrid board 10' (in this example, an intermediate product) similar to the conventional opto-electric hybrid board 10 shown in FIG. 10 and shaped such that opposite edge portions of the electric circuit board E protrude outwardly from opposite edge portions of the optical waveguide W on opposite sides thereof extending in the longitudinal direction of the optical waveguide W is provided. Then, as indicated by arrows in FIG. 6, boundary portions between the opposite edge portions (cross-hatched portions in the figure) of the electric circuit board E which are to be removed and a portion of the electric circuit board E which is to be left unremoved are irradiated with laser light (laser light having a wavelength of 355 nm). Thus, the boundary portions are cut by the removal operation. Then, the opposite edge portions of the electric circuit board E which are to be removed are stripped away from the optical waveguide W. This provides the opto-electric hybrid board 10 shaped such that the optical waveguide W protrudes leftwardly and rightwardly from the electric circuit board E, as shown in FIG. 1B.

As mentioned earlier, the portions of the electric circuit board E which are cut by means of the laser light irradiation are the organic base material layer X (having a low laser light transmittance Q, the laser light having a wavelength of 355 nm) comprised of the insulation layer 1 and the coverlay 3. Also, the portions of the optical waveguide W which are disposed immediately under the cut portions are the layer (having a laser light transmittance P much higher than the transmittance Q, the laser light having a wavelength of 355 nm) comprised of the under cladding layer 6 and the over cladding layer 8.

In the opto-electric hybrid board 10 obtained by cutting the opto-electric hybrid board 10' (intermediate product) shown in FIG. 6 by means of the laser light irradiation as shown, the organic base material layer X allows less laser light to pass therethrough during the removal of the organic base material layer X by means of the laser light irradiation, so that the removal operation by means of the laser light is effectively performed on the organic base material layer X. The removed end surfaces of the organic base material layer X, i.e. the end surfaces of the organic base material layer X which face the uncovered optical waveguide portions, become elaborate, and the outline shape of the removed portions has high dimensional accuracy. Most of the laser light is transmitted through the optical waveguide W lying under the organic base material layer X to exert no influence on the optical waveguide W. This prevents the surface portions of the optical waveguide W which are uncovered by the removal of the organic base material layer X from being impaired by the laser light, and prevents the interior of the optical waveguide W from being thermally damaged, so that high quality is maintained in the optical waveguide W.

In addition, this opto-electric hybrid board 10 is configured such that the opposite longitudinal edge portions of the optical waveguide W protrude sideways from the opposite edge portions of the electric circuit board E. This prevents the electric circuit board E, which is relatively thin and susceptible to damage as in the conventional product shown in FIG. 10, from being impaired by external impacts. Thus, the opto-electric hybrid board 10 is capable of maintaining excellent quality over a long time with stability.

Figure 7A:
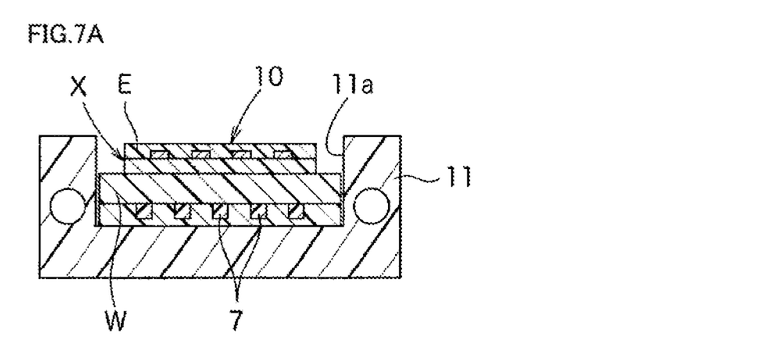
FIGS. 7A and 7B are illustrations about the effects of the opto-electric hybrid board.

For example, when this opto-electric hybrid board 10 is fitted into a ferrule and used as a connector, the outside shape of the optical waveguide W formed using the cores 7 as a reference is fitted snugly in a recess 11a of a ferrule 11, as shown in FIG. 7A. This prevents the misalignment of the cores 7 of the optical waveguide W to easily achieve precise optical coupling.

Figure 7B:
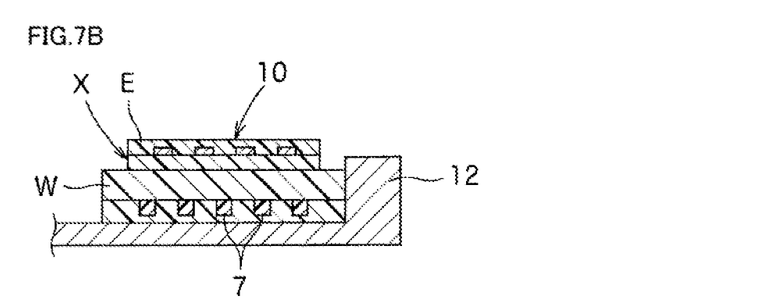

The use of the opto-electric hybrid board 10 is not limited to the use thereof as a connector. As shown in FIG. 7B, for example, the opto-electric hybrid board 10 may be transported or transferred, with the bottom and side surfaces of the relatively thick optical waveguide W fitted along a guide 12, during the quality inspection of products and during the transport, transfer, or the like of the products. Thus, not only the electric circuit board E but also the protruding portions of the optical waveguide W are less susceptible to impacts, so that the quality of the cores 7 and the electric circuit board E is not impaired. Also, the opto-electric hybrid board 10 is less prone to be misaligned relative to the guide 12. This allows the cores 7 to be inspected in a precise position in an inspection step, to thereby suppress the occurrence of inspection error.

For the operation of partially removing the organic base material layer X laminated to the optical waveguide W by means of laser light irradiation without affecting the optical waveguide W as in the aforementioned example, it is necessary that the laser light transmittances Q and P in the organic base material layer X and the optical waveguide W satisfy the following inequalities (1) and (2).

$$P \geq 70\% \tag{1}$$

$$P - Q \geq 25\% \tag{2}$$

The laser light transmittances Q and P of the organic base material layer X and the optical waveguide W are adjusted depending on the type and mixing ratio of materials for the formation thereof. The entire organic base material layer X need not have the aforementioned optical properties, but at least portions (including boundary portions between to-be-removed portions and remaining portions) of the organic base material layer X which are to be removed by the laser light irradiation are only required to have the transmittance Q. Likewise, at least portions of the optical waveguide W which overlap the portions of the organic base material layer X which are to be removed by the laser light irradiation are only required to have the transmittance P.

As the transmittance Q of the organic base material layer X decreases, the energy used for the removal operation increases and the operation efficiency accordingly increases preferably. Thus, the transmittance Q is in general preferably not greater than 70%, more preferably not greater than 50%, and further preferably not greater than 30%, although depending on the type of laser light. A preferable example of the material for the formation of the organic base material layer X includes polyimide resins widely used for the insulation layer of the opto-electric hybrid board and the like. The polyimide resins are excellent in insulation properties and thermal resistance, and are suitable for the removal operation by means of the laser light irradiation. The insulation layer 1 and the coverlay 3 may be made of the same material or different materials. In the case where the insulation layer 1 and the coverlay 3 are made of different materials, the transmittance of a material having a higher laser light transmittance is defined as the transmittance Q of the organic base material layer X, and may be used in a preferable range of the present disclosure.

As the transmittance P of the optical waveguide W increases, the influence of laser light upon the optical waveguide W decreases preferably because the laser light is transmitted as it is through the optical waveguide W. Thus, the transmittance P is required to be not less than 70% as described above. In particular, the transmittance P is preferably not less than 80%, and more preferably not less than 90%. In consideration of the efficiency of the operation of removing the organic base material layer X by means of the laser light irradiation, the difference (P–Q) between the transmittances P and Q must be not less than 25% as described above. In particular, the difference is preferably not less than 50%, and more preferably not less than 70%. An example of the material for the formation of such an optical waveguide W includes photosensitive epoxy resins. A photosensitive epoxy resin as highly transparent as possible is preferably used.

In the aforementioned example, the thickness of the electric circuit board E and the thickness of the optical waveguide W are set as appropriate depending on the intended use and required performance of the opto-electric hybrid board 10. In general, the thickness of the optical waveguide W is preferably greater than the thickness of the electric circuit board E. In particular, it is preferable that the thickness of the electric circuit board E is on the order of 3 to 200 µm and the thickness of the optical waveguide W is on the order of 20 to 500 µm. Such a configuration prevents the insulative portion of the electric circuit board E from being impacted, unlike the conventional opto-electric hybrid board, while the entire opto-electric hybrid board 10 is relatively thin and flexible. When the opto-electric hybrid board 10 is used as a connector, such a configuration prevents misalignment of the cores 7 to produce more practical effects. In the preferable range of 3 to 200 µm, the thickness of the electric circuit board E is particularly preferably in the range of 5 to 100 µm, and further preferably in the range of 5 to 50 µm.

In the electric circuit board E, the organic base material layer X including the insulation layer 1 and the coverlay 3 preferably has a thickness in the range of 1 to 100 µm, for example. If the organic base material layer X is too thin, there is apprehension that the organic base material layer X becomes insufficient in insulation properties and in strength. On the other hand, if the organic base material layer X is too thick, the flexibility of the organic base material layer X is impaired, and a great amount of laser light irradiation energy is required to remove the unnecessary portions of the organic base material layer X, which is not preferable in costs and in influence on the optical waveguide W.

In the aforementioned example, it is preferable that a difference or distance (denoted by D in FIG. 1B) between a side surface of the electric circuit board E and a side surface of the optical waveguide W as seen from above is not greater than 2 mm. Specifically, if the difference D is greater than 2 mm, the portions of the optical waveguide W which protrude sideways from the opposite side edges of the electric circuit board E become too large. If these portions are subjected to great impacts, there is apprehension that distortion stresses or the like are produced in the optical waveguide W to exert adverse effects on the propagation of light, which is not preferable. If the difference D is too large, it is difficult to cut and strip only the boundary portions in the removal operation by means of the laser light irradiation as described above. This necessitates the removal of all of the opposite edge portions of the electric circuit board E which are relatively large in area. As a result, it requires much time to perform the removal operation or large amounts of materials are wasted, which is not preferable.

In the present disclosure, the difference D may be equal to 0 (zero), that is, the width of the electric circuit board E and the width of the optical waveguide W may be exactly the same. This is because the electric circuit board E and the optical waveguide W are not subjected to impacts on one side unless one of the electric circuit board E and the optical waveguide W protrude. In this case, the electric circuit board E and the optical waveguide W are initially produced in such a configuration such that the opposite side edges of the electric circuit board E protrude from the opposite side edges of the optical waveguide W, and the protruding portions are then removed by the laser light irradiation, as in the aforementioned example. Thus, it is important that the laser light transmittances Q and P of the organic base material layer X and the optical waveguide W in the opto-electric hybrid board 10 satisfy the aforementioned inequalities (1) and (2).

Figure 8A:
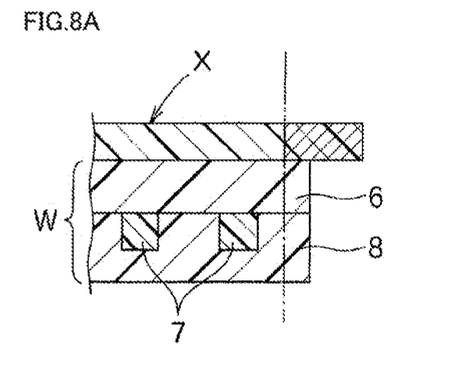
FIGS. 8A to 8E are illustrations showing other embodiments of an optical waveguide laminate according to the present disclosure.
Figure 8B:
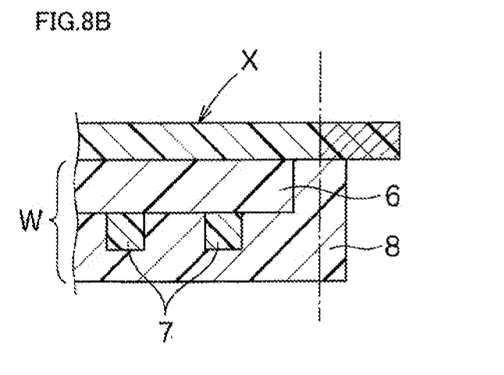
Figure 8C:
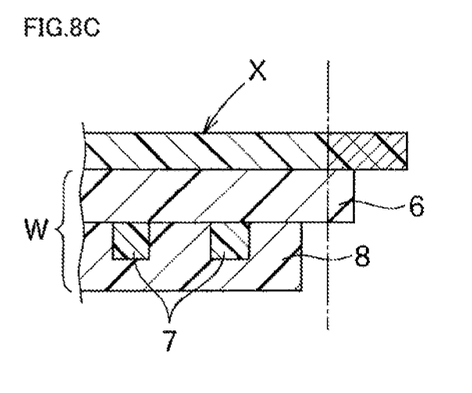

In the aforementioned example, the portion of the optical waveguide W which lies immediately under the portion of the organic base material layer X comprised of the insulation layer 1 and the coverlay 3 which is to be cut by means of the laser light irradiation is comprised of the under cladding layer 6 and the over cladding layer 8 which are laminated together, as shown in FIG. 8A. However, the configuration of the optical waveguide W under the to-be-cut portion is not limited to this. For example, the portion of the optical waveguide W which lies immediately under the to-be-cut portion may be comprised of only the over cladding layer 8, as shown in FIG. 8B, or may be comprised of only the under cladding layer 6, as shown in FIG. 8C.

Figure 8D:
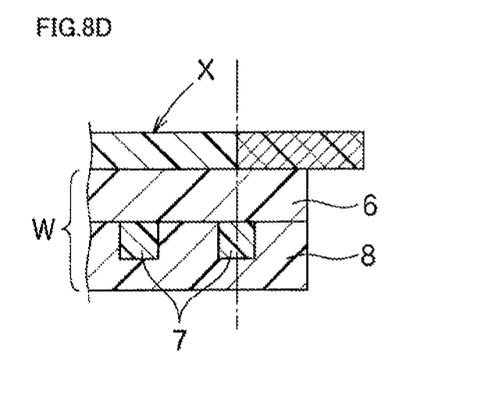
Figure 8E:
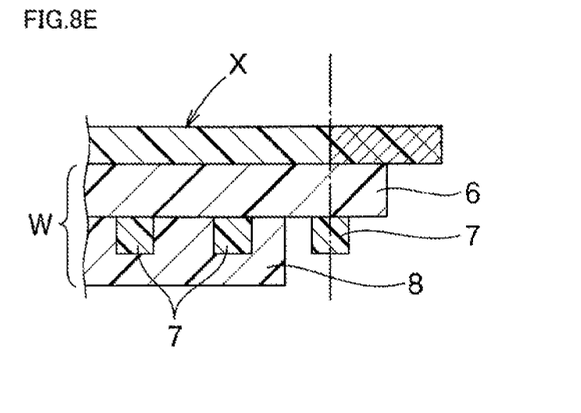
Figure 9A:
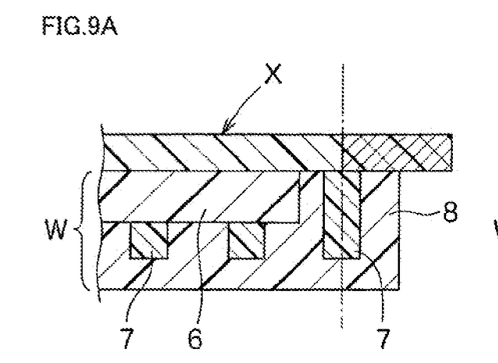
FIGS. 9A and 9B are illustrations showing still other embodiments of the optical waveguide laminate according to the present disclosure.
Figure 9B:
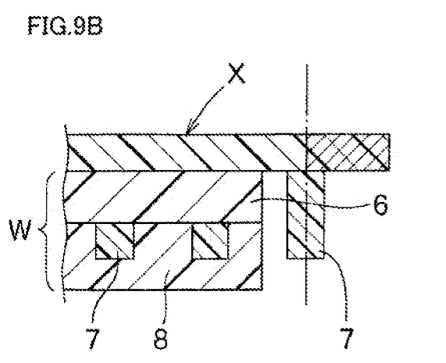

Alternatively, the portion of the optical waveguide W which lies immediately under the to-be-cut portion may be comprised of three layers: the under cladding layer 6, one of the cores 7, and the over cladding layer 8, as shown in FIG. 8D, or may be configured such that one of the cores 7 is uncovered on the front surface (the lower surface as seen in the figure) of the under cladding layer 6, as shown in FIG. 8E. Further, the portion of the optical waveguide W which lies immediately under the to-be-cut portion may be comprised of two layers: one of the cores 7 and the over cladding layer 8, as shown in FIG. 9A, or may be comprised of only one of the cores 7, as shown in FIG. 9B.

In the aforementioned examples, the present disclosure is applied to the opto-electric hybrid board 10. However, the present disclosure is not limited to applications to the opto-electric hybrid board 10. The present disclosure may be widely applied to an optical waveguide laminate configured such that the organic base material layer X such as the insulation layer 1 is laminated to one or both surfaces of the optical waveguide W and a portion of the organic base material layer X is lacking because of the removal by means of laser light irradiation, so that a surface of the optical waveguide W is partially uncovered.

In the opto-electric hybrid board 10 in the aforementioned examples, the opposite side surfaces of the electric circuit board E extending in the longitudinal direction of the optical waveguide W, i.e. the opposite side surfaces of the organic base material layer X comprised of the insulation layer 1 and the coverlay 3, are removed by the laser light irradiation. However, the region of the organic base material layer X to be removed by the laser light irradiation is not limited to the opposite side surfaces of the organic base material layer X extending in the longitudinal direction of the optical waveguide W, but may be any portion of the organic base material layer X.

Moreover, the organic base material layer X may be a laminate comprised of a plurality of layers as in the aforementioned example or a single layer so long as part of the organic base material layer X is removed.

EXAMPLES

Next, inventive examples of the present disclosure will be described in conjunction with comparative examples. It should be noted that the present disclosure is not limited to the inventive examples.

Inventive Examples 1 to 9 and Comparative Examples 1 to 4

Using materials for the optical waveguide W and materials for the organic base material layer X to be described later, the organic base material layer X (having a total thickness of 15 μm: insulation layer thickness of 10 μm+coverlay thickness of 5 μm) was laminated to one surface of the optical waveguide W (having a total thickness of 110 μm: Clad1 thickness of 40 μm+Clad2 thickness of 30 μm+Core thickness of 40 μm) in accordance with conventional practice, whereby 13 specimens (products of Inventive Examples 1 to 9 and products of Comparative Examples 1 to 4) imitating optical circuit boards were produced in which combinations of the materials of the optical waveguide W and the materials of the organic base material layer X in portions to be laser machined were as listed in TABLE 1 below. Laser light irradiation was performed on these specimens in a direction of the thickness of the specimens through the use of four laser devices to be described later to remove only the organic base material layer X in one end edge portion (a region having a width of 50 μm) of each specimen. Magnified images of the removed portions were viewed with an electron microscope (with a magnifying power of 500 times), whereby whether the laser machining was suitable or not was evaluated. The following three evaluations were made: the number of times of laser machining for the removal of the organic base material layer X; whether the removal of the organic base material layer X became insufficient to leave residues (portions left unremoved) or not; and whether traces of machining (lumps resulting from fusion or heat) were left on the surface of the optical waveguide W after the removal of the organic base material layer X or not. The results were listed in TABLE 1 below in conjunction with a laser light transmittance (%), the laser light having a source wavelength, of each material.

[Evaluations]

∘∘ (excellent): No traces and no residues are formed in one or a plurality of cutting operations.

∘ (good): No traces and no residues are formed in one cutting operation although minute traces are formed in some cases in a plurality of cutting operations.

Δ (acceptable): Minute residues are formed in some cases but no traces are formed in one cutting operations. No residues are formed but minute traces are formed in some cases in a plurality of cutting operation.

NG1: Not only the organic base material layer X but also the optical waveguide W is cut in one cutting operation, so that large traces are formed in the optical waveguide W.

NG2: The organic base material layer X cannot be cut even if a plurality of cutting operations are repeated.

[Materials for Optical Waveguide W]

Clad1: 80 parts by weight of a liquid long-chain bifunctional semi-aliphatic epoxy resin (EXA-4816 available from DIC Corporation).

20 parts by weight of an epoxy resin containing an alicyclic skeleton (EHPE-3150 available from Daicel Chemical Industries, Ltd.).

2 parts by weight of a photo-acid generator (SP-170 available from ADEKA Corporation).

40 parts by weight of ethyl lactate (available from Musashino Chemical Laboratory, Ltd.).

Clad2: The following material was added to the materials of Clad1.

2 parts by weight of TINUVIN479 (available from BASF Japan Ltd.).

Core: 50 parts by weight of o-cresol novolac glycidyl ether (YDCN-700-10 available from Nippon Steel & Sumikin Chemical Co., Ltd.).

50 parts by weight of bisphenoxyethanolfluorene diglycidyl ether (OGSOL-EG-100 available from Osaka Gas Chemicals Co., Ltd.).

1 part by weight of a photo-acid generator (SP-170 available from ADEKA Corporation).

50 parts by weight of ethyl lactate (available from Musashino Chemical Laboratory, Ltd.).

[Materials for Organic Base Material Layer X]

PI1: Core-layer polyamide acid varnish described in paragraphs [0063] to [0066] of JP-A-2005-165138.

PI2: Photosensitive polyamide composition C described in paragraphs [0064] to [0071] of JP-A-2013-100441.

PI3: Core-layer polyamide acid varnish described in paragraphs [0063] to [0066] of JP-A-2005-165138 under different deposition conditions with a different laser light transmittance Q.

Clad2: The following material was added to the materials of Clad1.

2 parts by weight of TINUVIN479 (available from BASF Japan Ltd.).

[Laser Devices]

Nanosecond YAG laser having a laser light source wavelength of 266 nm (available from Coherent, Inc.).

Nanosecond YAG laser having a laser light source wavelength of 355 nm (available from LIGHTWAVE Corporation).

Nanosecond YAG laser having a laser light source wavelength of 532 nm (available from Coherent, Inc.).

Nanosecond YAG laser having a laser light source wavelength of 1064 nm (available from Coherent, Inc.).

[Method of Measuring Laser Light Transmittances P and Q of Optical Waveguide Wand Organic Base Material Layer X]

Graphs showing relationships between the wavelength of light and the transmittance of the respective layers were obtained using an integrating-sphere light beam transmittance measuring device (V-670 available from JASCO Corporation). Thereafter, the laser light transmittance, the laser light having source wavelength, was determined. Single-layer films having the same thickness as the respective layers of the optical waveguide W and the organic base material layer X forming the portions to be laser machined were produced. These films were sequentially set on the integrating-sphere light beam transmittance measuring device (V-670), and the transmittances of the films for all light beams were measured. If scattering on surfaces was large during the measurement, a tubular quartz glass was filled with liquid paraffin (liquid), and the measurement was made while the films were immersed in the liquid paraffin.

TABLE 1

|  | Inventive Examples | | | | | | | | | Comparative Examples | | | |
| --- | --- | --- | --- | --- | --- | --- | --- | --- | --- | --- | --- | --- | --- |
|  | 1 | 2 | 3 | 4 | 5 | 6 | 7 | 8 | 9 | 1 | 2 | 3 | 4 |
| Laser light source wavelength (nm) | 355 | 355 | 355 | 532 | 532 | 532 | 532 | 532 | 355 | 266 | 266 | 355 | 1064 |
| Material of W in portions to be laser machined | Clad1 | Clad1 | Core | Clad1 | Clad2 | Clad2 | Core | Clad1 | Clad1 | Clad1 | Clad2 | Clad2 | Clad1 |
| Material of X in portions to be laser machined | PI2 | PI1 | PI2 | PI1 | PI1 | PI2 | PI1 | PI3 | Clad2 | PI1 | PI2 | PI2 | PI2 |
| Laser light transmittance P of W (%) | 88 | 88 | 82 | 99 | 95 | 95 | 99 | 99 | 88 | 65 | 35 | 17 | 100 |
| Laser light transmittance Q of X (%) | 0 | 10 | 0 | 70 | 70 | 45 | 70 | 72 | 17 | 0 | 0 | 0 | 84 |
| Transmittance difference P − Q (%) | 88 | 78 | 82 | 29 | 25 | 50 | 29 | 27 | 71 | 65 | 35 | 17 | 16 |
| Number of times of machining (times) | 1 | 1 | 1 | 1 | 1 | 1 | 1 | 2 | 1 | 1 | 1 | 1 | 4 |
| Suitability of laser machining | ⊚ | ⊚ | ⊚ | ⊚ | ⊚ | ⊚ | ⊚ | Δ | ○ | NG1 | NG1 | NG1 | NG2 |

The aforementioned results show that the organic base material layer X in each of the products of Inventive Examples 1 to 9 is removed generally satisfactorily without influences such as damage upon the uncovered surface of the optical waveguide W by performing the laser machining once or a plurality of times on the organic base material layer X in the portions of the organic base material layer X which are to be removed by means of the laser machining. On the other hand, the aforementioned results show that each of the products of Comparative Examples 1 to 4 has problems such that the optical waveguide W is cut to the inside and the organic base material layer X is not cut.

Although specific forms in the present disclosure have been described in the aforementioned examples, the aforementioned examples should be considered as merely illustrative and not restrictive. It is contemplated that various modifications evident to those skilled in the art could be made without departing from the scope of the present disclosure.

The present disclosure is applicable to the provision of an optical waveguide laminate in which an organic base material layer laminated to an optical waveguide is partially removed by laser light irradiation and the optical waveguide is not thermally affected by the laser light irradiation and in which high quality is maintained.

REFERENCE SIGNS LIST

1 Insulation layer
3 Coverlay
10 Opto-electric hybrid board
W Optical waveguide
X Organic base material layer

The invention claimed is:

1. An optical waveguide laminate comprising:
an optical waveguide; and
an organic base material layer laminated to at least one surface of the optical waveguide, wherein the optical waveguide laminate has an uncovered optical waveguide portion in which a portion of the organic base material layer laminated to the optical waveguide is lacking so that the optical waveguide is uncovered in the portion, and
wherein the following inequalities (1) and (2) are satisfied:

$$P \geq 70\% \qquad (1)$$

$$P - Q \geq 25\% \qquad (2)$$

where P is a laser light transmittance of the optical waveguide, the laser light having a predetermined wavelength range, and Q is a laser light transmittance of the organic base material layer.

2. The optical waveguide laminate according to claim 1, wherein the laser light transmittance Q of the organic base material layer is not greater than 70%.

3. The optical waveguide laminate according to claim 1, wherein the organic base material layer is a polyimide resin layer.

4. The optical waveguide laminate according to claim 1, wherein an end surface of the organic base material layer is a laser-cut surface.

5. A method of manufacturing an optical waveguide laminate, comprising:
laminating an organic base material layer to at least one surface of an optical waveguide; and
removing a portion of the organic base material layer by irradiating the portion of the organic base material layer with laser light having a predetermined wavelength range, thereby forming an uncovered optical waveguide portion, wherein P, a laser light transmittance of the optical waveguide, and Q, a laser light transmittance of the organic base material, satisfy the following inequalities (1) and (2):

$$P \geq 70\% \quad (1)$$

$$P-Q \geq 25\% \quad (2).$$

6. The method of manufacturing an optical waveguide laminate according to claim 5, wherein the laser light transmittance Q of the organic base material layer is not greater than 70%.

7. The method of manufacturing an optical waveguide laminate according to claim 5, wherein the organic base material layer is a polyimide resin layer.

* * * * *